US012640067B2

(12) United States Patent
Wei et al.

(10) Patent No.: US 12,640,067 B2
(45) Date of Patent: May 26, 2026

(54) DISPLAY MOTHER BOARD, DISPLAY PANEL AND DISPLAY APPARATUS

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Qibing Wei, Wuhan (CN); Peng Zhang, Wuhan (CN); Xingyao Zhou, Wuhan (CN)

(73) Assignees: Wuhan Tianma Microelectronics Co, Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 201 days.

(21) Appl. No.: 18/784,866

(22) Filed: Jul. 25, 2024

(65) Prior Publication Data

US 2024/0386821 A1 Nov. 21, 2024

(30) Foreign Application Priority Data

Dec. 7, 2023 (CN) .......................... 202311689458.8

(51) Int. Cl.
*G09G 3/00* (2006.01)
*H10D 86/40* (2025.01)
*H10D 86/60* (2025.01)

(52) U.S. Cl.
CPC ........... *G09G 3/006* (2013.01); *H10D 86/443* (2025.01); *H10D 86/60* (2025.01); *G09G 2330/12* (2013.01)

(58) Field of Classification Search
CPC .. G09G 3/006; G09G 2330/12; H10D 86/443; H10D 86/60; G09F 9/30
See application file for complete search history.

(56) References Cited

U.S. PATENT DOCUMENTS

| | | | | |
|---|---|---|---|---|
| 9,262,953 | B2 * | 2/2016 | Jeong ..................... | G09G 3/006 |
| 2024/0355250 | A1 * | 10/2024 | Jia ............................ | G09G 3/32 |
| 2025/0292711 | A1 * | 9/2025 | Kim ....................... | G09G 3/006 |

FOREIGN PATENT DOCUMENTS

| | | |
|---|---|---|
| CN | 110646965 A | 1/2020 |
| CN | 113341600 A | 9/2021 |
| CN | 115509049 A | 12/2022 |

OTHER PUBLICATIONS

Chinese Office Action mailed Feb. 13, 2026, issued in related Chinese Application No. 202311689458.8 (25 pages).

* cited by examiner

*Primary Examiner* — Giovanni Astacio-Oquendo

(74) *Attorney, Agent, or Firm* — Wiersch Law Group

(57) ABSTRACT

Provided is a display mother board including a plurality of sub-regions. At least two sub-regions are arranged in a first direction. The sub-region includes a display panel including a display region, a wiring region and a step region arranged in the first direction, and test pads. The display panel includes a first panel edge, which is an edge of the step region and extends in a second direction intersecting the first direction. The test pads are located on a side of the first panel edge adjacent to the display region. The sub-region includes at least one first pad group each including a plurality of test pads arranged in a direction different from the second direction. Also provided are a display panel formed by cutting the display mother board and a display apparatus including the display panel.

20 Claims, 17 Drawing Sheets

DISPLAY MOTHER BOARD, DISPLAY PANEL AND DISPLAY APPARATUS

CROSS-REFERENCE TO RELATED APPLICATIONS

The present disclosure claims priority to Chinese Patent Application No. 202311689458.8, filed on Dec. 7, 2023, the content of which is incorporated herein by reference in its entirety.

TECHNICAL FIELD

The present disclosure relates to the display field, and in particular, to a display mother board, a display panel and a display apparatus.

BACKGROUND

In the manufacturing process of display panels, in order to improve production efficiency, multiple display panels are formed based on a display mother board with a large area, and then the display mother board is cut along cutting lines and is divided into a plurality of independent display panels.

However, at present, the typesetting rate of the display mother board is low, resulting in a low material utilization rate and material waste.

SUMMARY

In a first aspect of the present disclosure, a display mother board is provided. The display mother board includes a plurality of sub-regions. At least two sub-regions of the plurality of sub-regions are arranged in a first direction. One of the plurality of sub-regions includes: a display panel including a display region, a wiring region, and a step region arranged in the first direction, and test pads. The display panel includes a first panel edge. The first panel edge is an edge of the step region and extends in a second direction intersecting the first direction. The test pads located on a side of the first panel edge adjacent to the display region. One of the sub-region includes at least one first pad group each including at least two test pads of the test pads, and the at least two test pads in the first pad group are arranged in a direction different from the second direction.

In a second aspect of the present disclosure, a display panel is provided. The display panel is formed by cutting a display mother board. The display mother board includes a plurality of sub-regions. At least two sub-regions of the plurality of sub-regions are arranged in a first direction. One of the plurality of sub-regions includes: a display panel including a display region, a wiring region, and a step region arranged in the first direction, and test pads. The display panel includes a first panel edge. The first panel edge is an edge of the step region and extends in a second direction intersecting the first direction. The test pads located on a side of the first panel edge adjacent to the display region. One of the sub-region includes at least one first pad group each including at least two test pads of the test pads, and the at least two test pads in the first pad group are arranged in a direction different from the second direction.

In a third aspect of the present disclosure, a display apparatus is provided. The display apparatus includes a display panel formed by cutting a display mother board. The display mother board includes a plurality of sub-regions. At least two sub-regions of the plurality of sub-regions are arranged in a first direction. One of the plurality of sub-regions includes: a display panel including a display region, a wiring region, and a step region arranged in the first direction, and test pads. The display panel includes a first panel edge. The first panel edge is an edge of the step region and extends in a second direction intersecting the first direction. The test pads located on a side of the first panel edge adjacent to the display region. One of the sub-region includes at least one first pad group each including at least two test pads of the test pads, and the at least two test pads in the first pad group are arranged in a direction different from the second direction.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in the following description are some embodiments of the present disclosure. For those skilled in the art, other drawings may also be obtained based on these drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

In this specification, it should be understood that the terms "basically", "approximately", "roughly", "about", "generally" and "substantially" described in the claims and embodiments of this disclosure refer to a reasonable process operation range or tolerance range, which can be substantially agreed, rather than an exact value.

Various modifications and changes can be made to the present disclosure without departing from the scope of the disclosure, which are obvious to those skilled in the art. Therefore, the present disclosure covers the modifications and changes of the present disclosure that fall within the scope of the corresponding claims (claimed technical solutions) and their equivalents. It should be noted that the embodiments in the present disclosure can be combined mutually in the case of no conflict.

Figure 1:
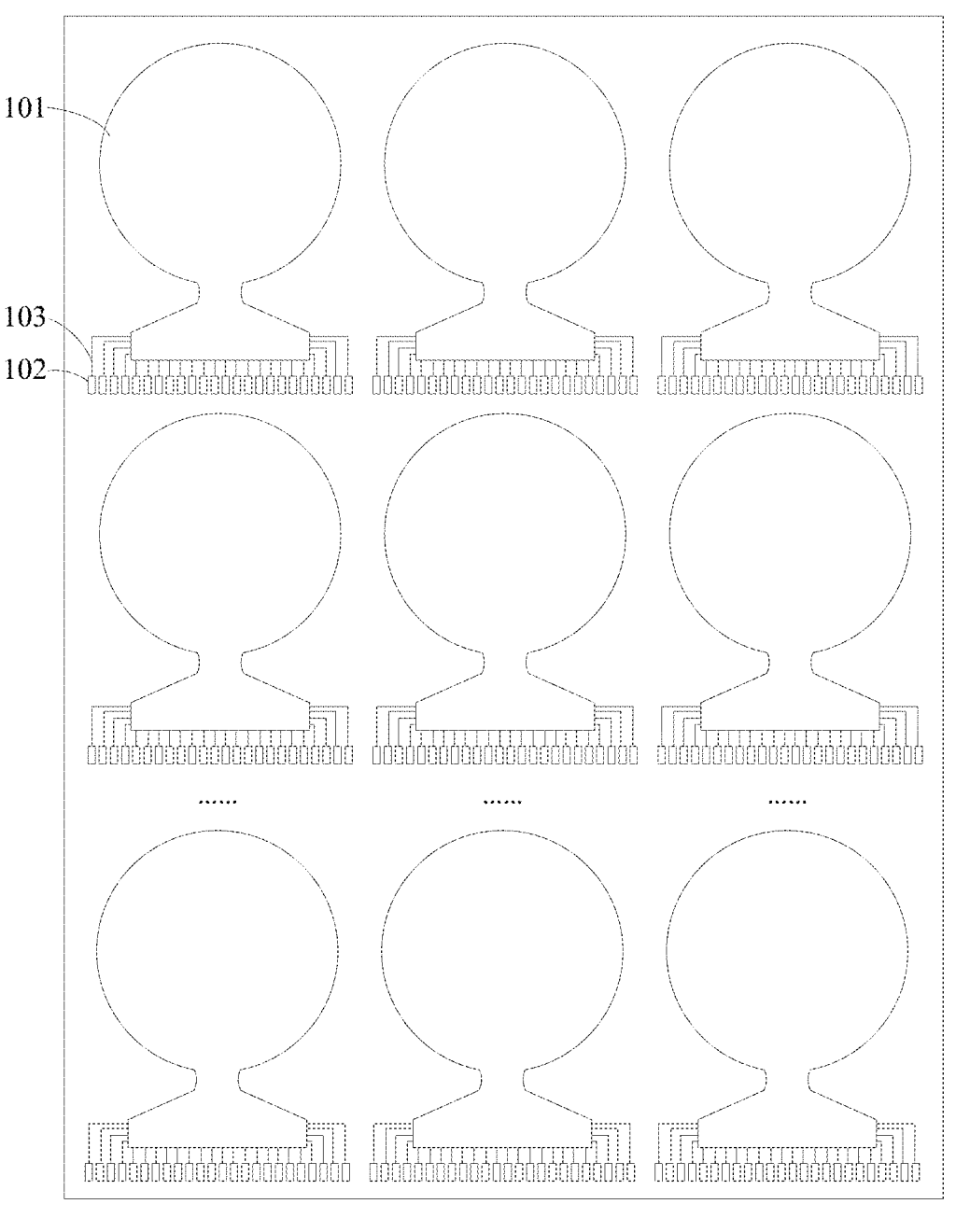
FIG. 1 is a schematic structural diagram of a display mother board in the related art.

As stated in the background above, the display panel is obtained by cutting a display mother board along cutting lines. FIG. 1 is a schematic structural diagram of a display mother board in the related art. As shown in FIG. 1, the display mother board includes a plurality of display panels 101 arranged in an array. Typically, before leaving the factory, the display panel 101 needs a voltage test (VT) to determine whether sub-pixels in the display panel 101 can emit light normally, so that the defective display panel 101 is prevented from entering subsequent processes, and resources are not wasted. Therefore, the display mother board is further provided with test pads 102 for the VT test of the display panel 101.

In the related art, the test pads 102 corresponding to the display panel 101 are typically arranged below a lower step of the display panel 101. For example, the test pads 102 are arranged between the display panels 101 and another display panel 101 adjacent it in a first direction x. However, such arrangement will seriously reduce the typesetting rate of the display mother board. Especially, the size of the display panel 101 of the wearable display product is small, and a large number of display panels 101 are formed in one display motherboard. If every display panel 101 is provided with such a space for arranging the test pads 102 below the display panel 101, the test pads 101 corresponding to the display panels 101 arranged in the first direction x occupy a space with a large overall width.

At present, the test pads 102 are arranged below the display panel 101, and a width, in the first direction x, of a space occupied by the test pad 102 itself and a line 103 that extends from the lower step and is connected to the test pad 102 is 3 mm. If 20 display panels 101 are arranged in the first direction x, a total width of such spaces corresponding to the 20 display panels 101 is 60 mm. Such space with a width of 60 mm corresponds to the size of at least one display panel 101, causing material waste.

Figure 2:
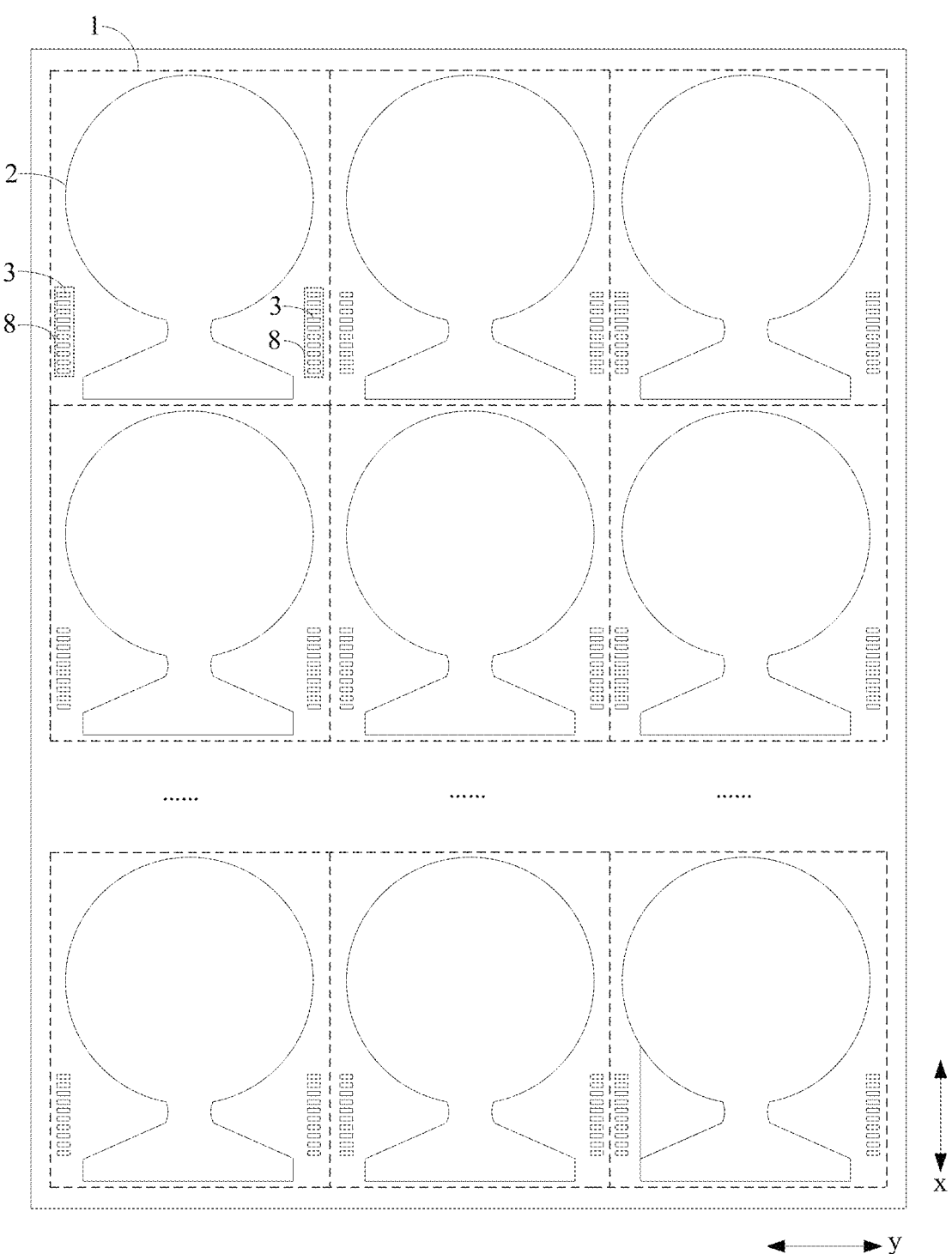
FIG. 2 is a schematic structural diagram of a display mother board according to some embodiments of the present disclosure.
Figure 3:
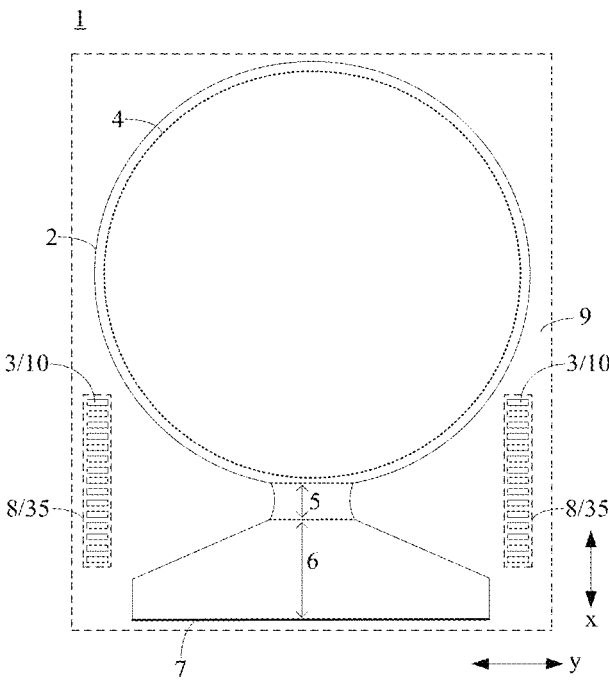
FIG. 3 is a schematic structural diagram of a single sub-region according to some embodiments of the present disclosure.

Embodiments of the present disclosure provide a display mother board. FIG. 2 is a schematic structural diagram of a display mother board according to some embodiments of the present disclosure. FIG. 3 is a schematic structural diagram of a single sub-region according to some embodiments of the present disclosure. As shown in FIG. 2 and FIG. 3, the display mother board includes a plurality of sub-regions 1. At least two sub-regions 1 are arranged in the first direction x. Each sub-region 1 includes a display panel 2 and test pads 3.

The display panel 2 may be a profiled display panel for a wearable device. The display panel 2 includes a display region 4, a wiring region 5, and a step region 6 arranged in the first direction x. The display panel 2 has a first panel edge 7. The first panel edge 7 is an edge of the step region 6 and extends in a second direction y, and the second direction y intersects the first direction x.

The test pads 3 are located on a side of the first panel edge 7 adjacent to the display region 4. The sub-region 1 includes at least one first pad group 8. The first pad group 8 includes a plurality of test pads 3, and the arrangement direction of the plurality of test pads 3 in the first pad group 8 is different from the second direction y.

It should be noted that, in some embodiments of the present disclosure, the side of the first edge panel 7 adjacent to the display region 4 includes a directly upper side and a diagonally upper side of the first edge panel 7. That is, the expression "the test pads 3 are located on the side of the first panel edge 7 adjacent to the display region 4" means that the test pads 3 are located on a side, adjacent to the display region 4, of a line segment (a straight line segment of a curving line segment) of the first panel edge 7. In the first direction x, at least part of the test pads 3 may overlap with the first edge panel 7, and/or, at least part of the test pads 3 may not overlap with the first edge panel 7.

It should be noted that "a plurality" in the expression "the first pad group 8 includes a plurality of test pads 3" means two or more. That is, the first pad group 8 may include two, three, or more test pads 3. The quantities of the test pads 3 in different first pad groups 8 may be different.

The display mother board is divided into display panels 101 by cutting. In one cutting method, the display mother board is cut along the outer edge of the sub-region 1 into a plurality of independent and to-be-further-cut panel structures. Then, a test voltage is applied to the test pad 3 in the panel structure, and the VT test is performed on the display panel 2 in the panel structure. Then, the panel structure is cut along the outer edge of the display panel 2 to obtain the independent display panel 2.

In some embodiments of the present disclosure, the test pads 3 corresponding to the display panel 2 are arranged on a side of the first panel edge 7 of the display panel 2 adjacent to the display region 4. That is, the test pads 3 are arranged above the line segment of the first panel edge 7. In this way, the additional space below the display panel 2 for arranging the test pads and connection wires is not required. As result, the distance between two display panels 2 adjacent in the first direction x is reduced, or even eliminated. Therefore, the number of display panels 2 arranged in the first direction x is increased, and the typesetting rate of the display mother board in the first direction x is effectively improved.

In addition, the arrangement direction of the test pads 2 in the first pad group 8 is different from the second direction y. The test pads 2 in the first pad group 8 are not arranged in a transverse direction. In this way, it is avoided that these test pads 2 occupy a large width in the second direction y and affect the distance between two display panels 2 adjacent in the second direction y, and the typesetting rate of the display mother board in the second direction y is not affected.

In some embodiments of the present disclosure, as shown in FIG. 3, the sub-region 1 further includes a cutting region 9 surrounding the display panel 2, the test pads 3 include a first test pad 10, and the first test pad 10 is located in the cutting region 9.

It should be noted that the test pads 3 are used for the VT test of the display panel 2 before the display panel 2 leaves factory. After the display panel 2 leaves factory, the test pads 3 are not required by normal display, so the first test pad 10 is in the cutting region 9 outside the display panel 2. After the VT test, the cutting region 9 including the first test pad 10 is cut off from the display panel 2. Therefore, the first test pad 10 does not occupy the space of the step region 6, and there is more space in the step region 6 for arranging the wires and pins for display function.

Figure 22:
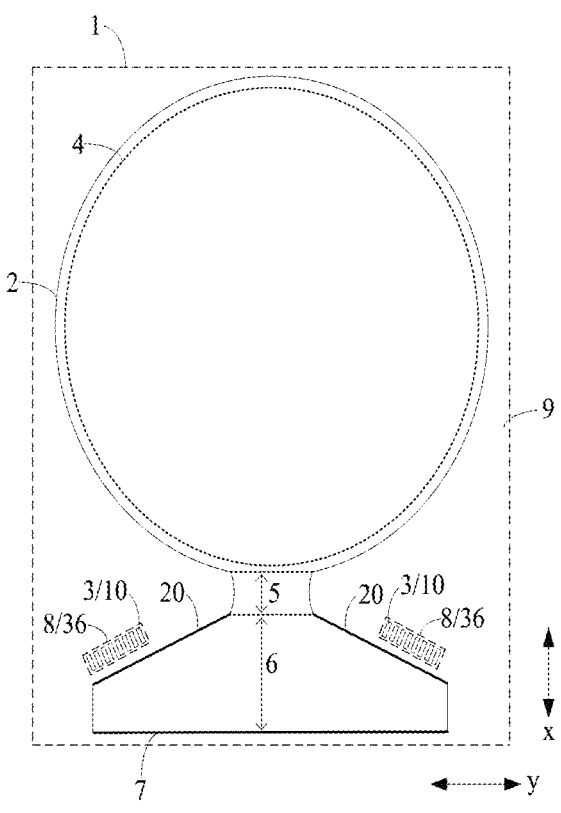
FIG. 22 is a schematic structural diagram of a single sub-region according to some embodiments of the present disclosure.

In addition, the cutting region 9 has a large space, and the first test pad 10 is located in the cutting region 9, so the number of the first test pads 10, the orientation of the first test pad 10, the size of the first test pad 10, the distance between the first test pads 10, and other parameters can be designed more flexibly. For example, the size of the first test pad 10 may be designed to be larger, so as to improve the connection reliability between a test signal terminal and the first test pad 10. For another example, as shown in FIG. 22, the inclination angle of the first test pad 10 may be changed, so that the orientation of the first test pad 10 is more flexible. In this way, the width of the space occupied by the first pad group 8 in the first direction x or the second direction y can be adjusted flexibly, so the first pad group 8 better matches the design space of the cutting regions 2 corresponding to different display panels to obtain a better universality.

In addition, since the first test pad 10 is located in the cutting region 9, a connection line connecting the pin in the step region 6 and the test pad 3 may extend in the cutting region 9. In this way, the degree of freedom of the layout of the connection lines is improved. For example, the load caused by the connection line can be adjusted by adjusting the width and length of the connection line, thereby improving the uniformity of the voltage drop of the test signal.

In some embodiments of the present disclosure, as shown in FIG. 3, a length of the wiring region 5 in the second direction y is smaller than a length of the display region 4 in the second direction y, and is also smaller than a length of the step region 6 in the second direction y, and at least one test pad 3 is located between the step region 6 and the display region 4. That is, when the first test pad 10 is located in the cutting region 9, the first test pad 10 may be located between the step region 6 and the display region 4.

Since the wiring region 5 has a small transverse width, there is a large cutting space between the display region 4 and the step region 6. By disposing at least one test pad 3 between the step region 6 and the display region 4, the space of the cutting region 9 can be reasonably utilized, and the number, the orientation, the size, the distance, and other parameters of these test pads 3 can be designed more flexibly. In addition, these test pads 3 may be located closer to the step region 6, thereby reducing the length of the connection lines connecting these test pads 3 and pins in the step region 6.

Figure 4:
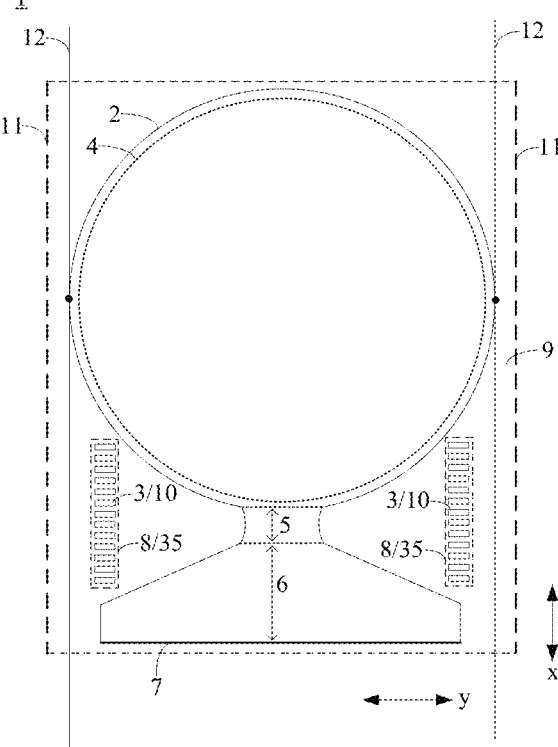
FIG. 4 is another schematic structural diagram of a single sub-region according to some embodiments of the present disclosure.

FIG. 4 is another schematic structural diagram of a single sub-region according to some embodiments of the present disclosure. In some embodiments of the present disclosure, as shown in FIG. 4, the sub-region 1 has first edges 11 extending in the first direction x. The test pad 3 is located on a side of a first straight line 12 away from the first edge 11 that is adjacent to the first straight line 12. The first straight line 12 extends in the first direction x and is tangent to the display panel 2 at a point of the display panel 2 closest to the first edge 11.

In this embodiment, the test pads 3 are not arranged beyond the first straight line 12, so it is not required to additionally increase the distance between the first straight line 12 and the first edge 11 for accommodating the test pads 3, thereby avoiding the influence on the distance between two display panels 2 adjacent in the second direction y. In addition, in this embodiment, the distance between the test pad 3 and the outer edge of the sub-region 1 is large. When cutting the display mother board along the outer edge of the sub-region 1, a malposition cutting (even occurs) will not affect the test pad 3, thereby improving the reliability of the VT test.

Figure 5:
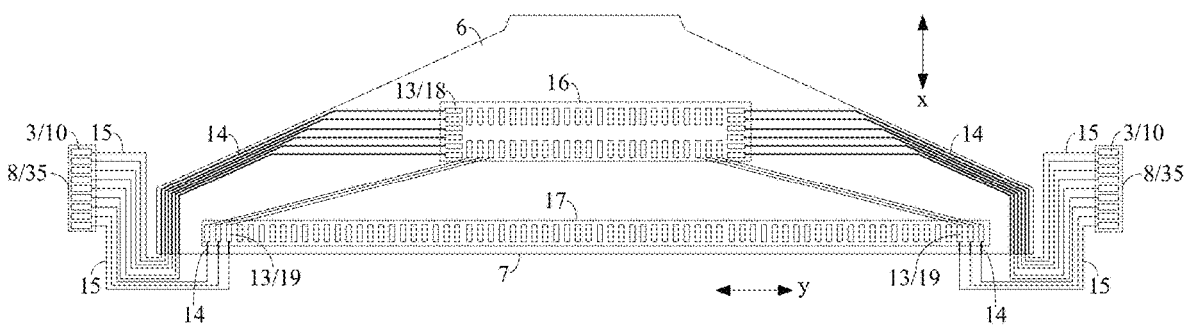
FIG. 5 is a schematic diagram showing connection between a pin and a test pad according to some embodiments of the present disclosure.
Figure 6:
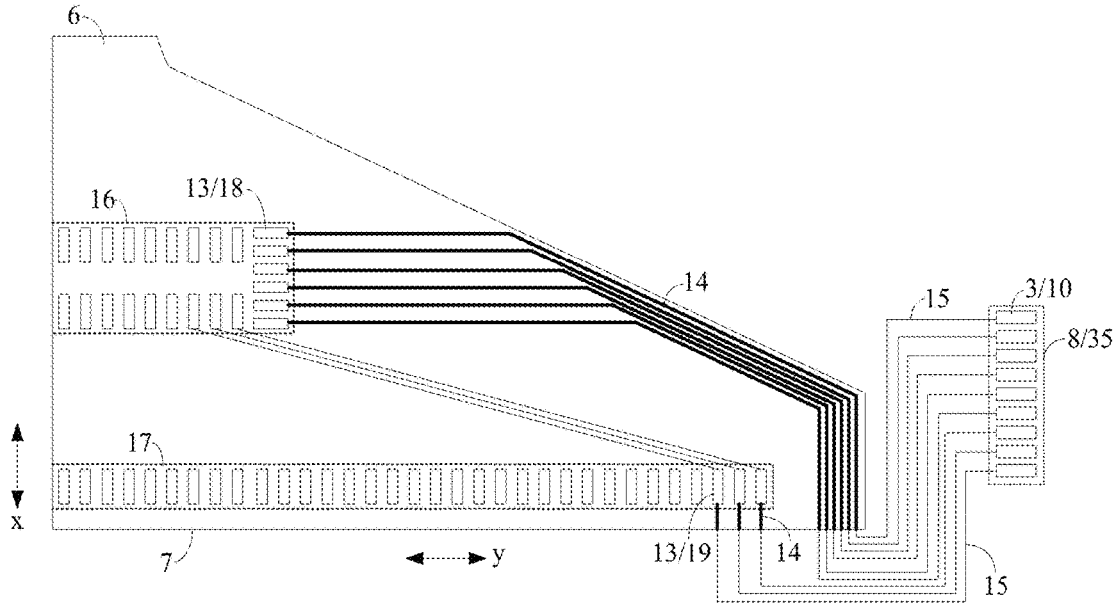
FIG. 6 is an enlarged partial view of FIG. 5 according to some embodiments of the present disclosure.

FIG. 5 is a schematic diagram showing connection between a pin and a test pad 3 according to some embodiments of the present disclosure. FIG. 6 is an enlarged partial view of FIG. 5 according to some embodiments of the present disclosure. In some embodiments of the present disclosure, as shown in FIG. 5 and FIG. 6, the step region 6 includes pins 13. Each of at least one of the pins 13 is electrically connected to a corresponding test pad 3 via a first connection line 14 and a second connection line 15 sequentially. The first connection line 14 extends in the step region 6 to the first panel edge 7. The second connection line 15 is connected to the first connection line 14 and extends from a side of the first panel edge 7 away from the display region 4 to the test pad 3 connected to the second connection line 15. It should be noted that such test pad 3 connected to the first connection line 14 and the second connection line 15 is located in the cutting region 9, and is the first test pad 10.

As shown in FIG. 5 and FIG. 6, the step region 6 may include a chip bonding region 16 and a circuit board bonding region 17 arranged in the first direction x, and the pins 13 include first pins 18 located in the chip bonding region 16 and second pins 19 located in the circuit board bonding region 17. At least one first pin 18 each is connected to the test pad 3 via the second pin 19. That is, such first pin 18 is connected to the second pin 19 via a connection line, and the second pin 19 is connected to the test pad 3 via another connection line. In this way, a signal transmission path between such first pin 18 and the test pad 3 is realized.

Additionally/alternatively, such first pin 18 is directly connected to the test pad 3 via a connection line, so that a signal transmission path between such first pin 18 and the test pad 3 is realized. Before the VT test of the display panel 2, the display panel 2 is bonded with a driving chip but is not bonded with a printed circuit board, the test pad 3 directly or indirectly supplies a test signal to the first pin 18 to control the operation of the driving chip and further drive the display panel 2 to display a test image.

The arrangement in which such pin 13 is electrically connected to the test pad 3 via the first connection line 14 and the second connection line 15 sequentially may include a situation in which the first pin 18 is electrically connected to the test pad 3 via the first connection line 14 and the second connection line 15 sequentially, and may also include a situation in which the second pin 19 is electrically connected to the test pad 3 via the first connection line 14 and the second connection line 15 sequentially. However, the second pin 19 connected to the test pin 3 may be connected to the first pin 18, or may be not connected to the first pin 18.

In the related art, the test pad 3 is located below the display panel 2, so when the pin 13 in the step region 6 is connected to the test pad 3, at least one connection line needs to extend in the step region 6 to the first panel edge 7 and then further extend substantially in the first direction x to electrically connect the test pad 3.

In some embodiments of the present disclosure, the positions of the test pads 3 are adjusted. When arranging the connection line between the pin 13 and the test pad 3, a line segment of the connection line extending in the step region 6 is kept, and the extending manner of the connection line outside the display panel 2 is adjusted to match the adjusted position of the test pad 3. That is, in the structure that the pin 13 is connected to the test pad 3 via the first connection line 14 and the second connection line 15 sequentially, it may be understood that the first connection line 14 is a line segment of the conventional connection line extending in the step region 6 to the first panel edge 7, and the second connection line 15 is a new connection line arranged outside the step region 6 according to the actual position of the test pad 3. In this way, it is not required to change the existing line in the display panel 2, and the change in the over layout is small.

It should be noted that the width of the metal line is much smaller than the length of the test pad 3 in the first direction x, so the second connection line 15 may extend in a region below the display panel 2 in the first direction x, and the second connection line 15 extending below the display panel 2 has a small width in the first direction x. Compared with the related art, such structure can reduce the distance between display panels adjacent in the first direction X.

In addition, in some embodiments of the present disclosure, when designing the second connection line 15, a part of the second connection line 15 and another part of the second connection line 15 are arranged in different layers. That is, the second connection line 15 may include a first connection sub-line and a second connection sub-line, and the first connection sub-line and the second connection sub-line are arranged in different layers. In addition, in a direction perpendicular to a plane of the display mother board, the first connection sub-line and the second connection sub-line overlap with each other. As a result, the width of the space occupied by the second connection line 15 below the display panel 2 can be further reduced, and the distance between display panels 2 adjacent in the first direction x is further reduced.

Figure 7:
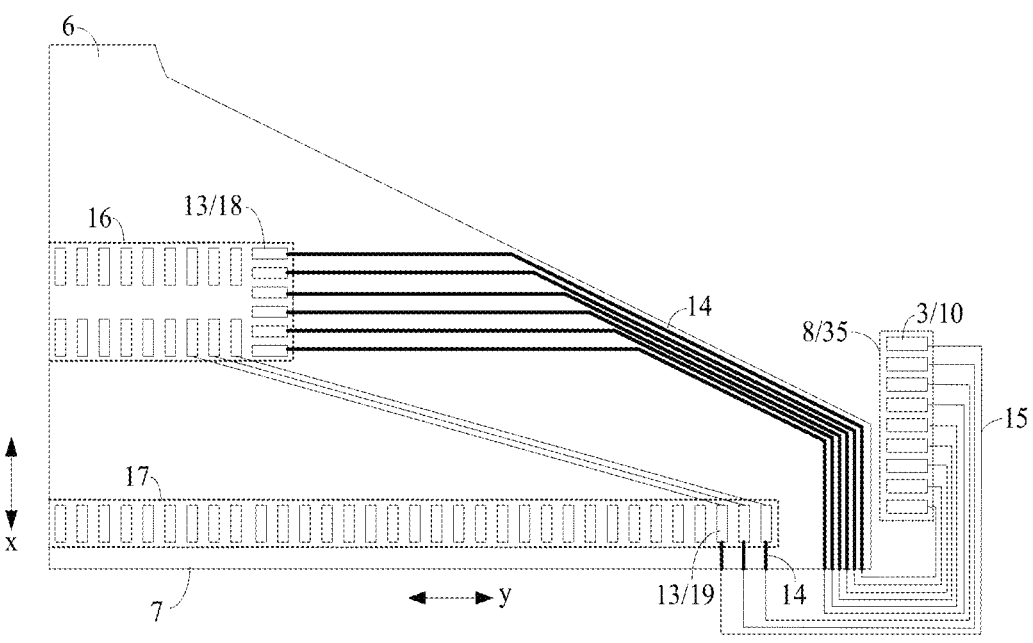
FIG. 7 is another schematic diagram showing connection between a pin and a test pad according to some embodiments of the present disclosure.
Figure 8:
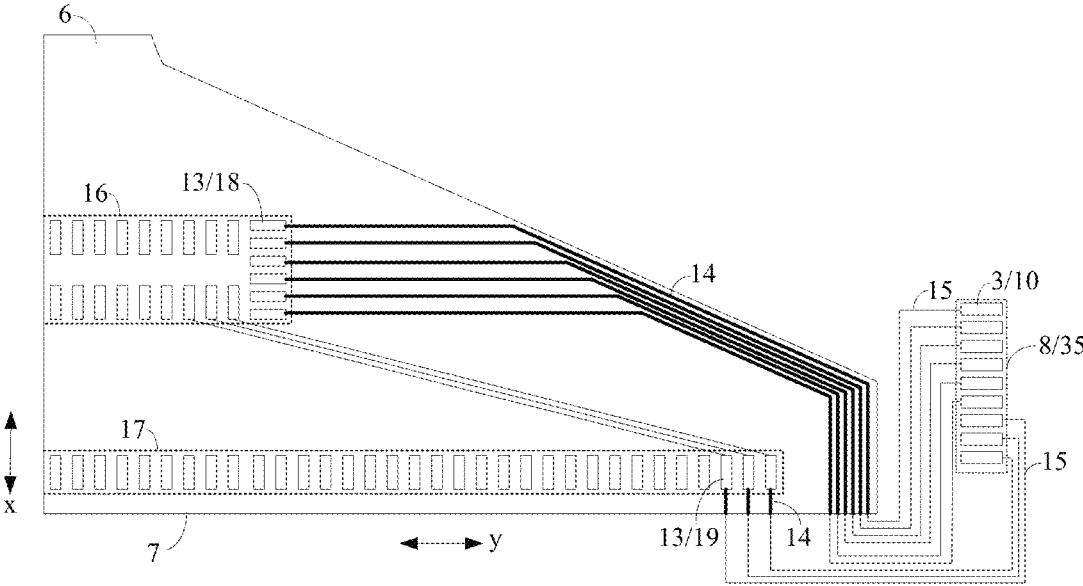
FIG. 8 is another schematic diagram showing connection between a pin and a test pad according to some embodiments of the present disclosure.

FIG. 7 is another schematic diagram showing connection between a pin and a test pad according to some embodiments of the present disclosure. FIG. 8 is another schematic diagram showing connection between a pin and a test pad according to some embodiments of the present disclosure. When each of one or more pins 14 is electrically connected to the test pad 13 via the first connection line 14 and the second connection line 15 sequentially, in some embodiments of the present disclosure, as shown in FIG. 5 to FIG. 8, each of one or more second connection lines 15 is connected to the test pad 3 at a side of the test pad 3 adjacent to the display panel 2, and/or, each of one or more second connection lines 15 is connected to the test pad 3 at a side of the test pad 3 away from the display panel 2.

In some embodiments of the present disclosure, as shown in FIG. 6 and FIG. 5, when the distance between the test pad 3 and the display panel 2 in the second direction y is large, all the second connection lines 15 are connected to the sides of the corresponding test pads 3 adjacent to the display panel 2. In this way, the space of the cutting region between the test pads 3 and the display panel 2 can be reasonably utilized, and it is avoided that the second connection line 15 occupies a space on a side of the test pad 3 away from the display panel 2, and the second connection line 15 is prevented from affecting the distance between two display panels 2 adjacent in the second direction y. In an alternative embodiment, as shown in FIG. 7, the distance between the test pad 3 and the display panel 2 in the second direction y is small, and all the second connection lines 15 are connected to the sides of the corresponding test pads 3 away from the display panel 2. In this way, there is enough space for arranging the second connection lines 15. In some embodiments of the present disclosure, as shown in FIG. 8, some second connection lines 15 are connected to the sides of the corresponding test pads 3 adjacent to the display panel 2, and the remaining second connection lines 15 are connected to the sides of the corresponding test pads 3 away from the display panel 2.

In addition, in some embodiments of the present disclosure, by selecting between the structure that the second connection line 15 is connected to the side of the test pad 3 adjacent to the display panel 2 and the structure that the second connection line 15 is connected to the side of the test pad 3 away from the display panel 2, the extending length of different second connection lines 15 are adjusted, and thus, the loads caused by the different second connection lines 15 are adjusted, thereby improving the uniformity of the voltage drop of the test signal.

It should be noted that, in some embodiments of the present disclosure, the first connection line 14 may have a line-changing arrangement. That is, the first connection line 14 may include at least two line segments arranged in different layers and electrically connected by one or more conductive via holes. Alternatively, the first connection line 14 may be a continuous transmission of entire line.

Figure 9:
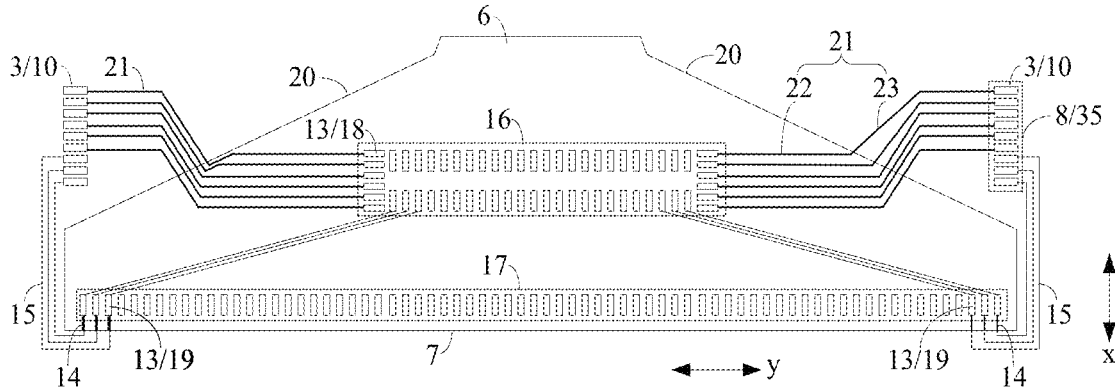
FIG. 9 is another schematic diagram showing connection between a pin and a test pad according to some embodiments of the present disclosure.
Figure 10:
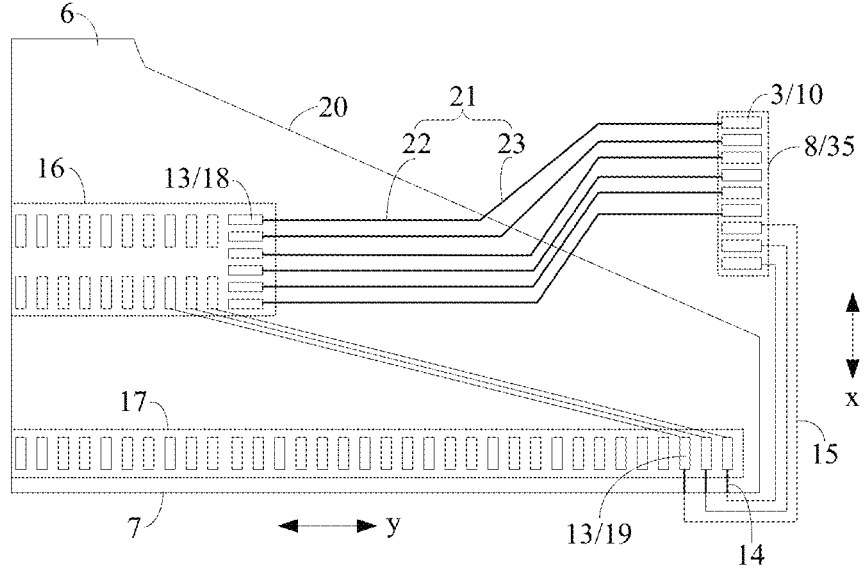
FIG. 10 is an enlarged partial view of FIG. 9 according to some embodiments of the present disclosure.

FIG. 9 is another schematic diagram showing connection between a pin and a test pad according to some embodiments of the present disclosure. FIG. 10 is an enlarged partial view of FIG. 9 according to some embodiments of the present disclosure. In some embodiments of the present disclosure, as shown in FIG. 9 and FIG. 10, the display panel 2 further has a second panel edge 20. The second panel edge 20 is the edge of the step region 6, and an extension direction of the second panel edge 20 forms a first angle with the first direction x and forms a second angle with the second direction y. That is, the second panel edge 20 is an edge at a shoulder of the step region 6.

The step region 6 includes pins 13. At least one of the pins 13 each is electrically connected to the test pad 3 via a third connection line 21. The third connection line 21 is located on a side of the first panel edge 7 adjacent to the display region 4, and the third connection line 21 runs through the second panel edge 20. The expression "the third connection line 21 is located on the side of the first panel edge 7 adjacent to the display region 4" means that the third connection line 21 is located on a side of a line segment where the first panel edge 7 is located adjacent to the display region 4.

In view of the above, the structure at least one of the pins 13 each is electrically connected to the test pad 3 via the third connection line 21 may include a situation that the first pin 18 is electrically connected to the test pad 3 via the third connection line 21, and may also include a situation that the second pin 19 is electrically connected to the test pad 3 via the third connection line 21. FIG. 9 and FIG. 10 show the situation that the first pin 18 is electrically connected to the test pad 3 via the third connection line 21.

In this structure, when arranging the connection line between the pin 13 and the test pad 3, at least some connection lines extend from the shoulder of the step region 6. In this way, the width of the space occupied by connection lines below the display panel 2 is reduced, thereby reducing the distance between two display panels adjacent in the first direction x.

Furthermore, as shown in FIG. 9 and FIG. 10, the step region 6 includes a chip bonding region 16 and a circuit board bonding region 17 arranged in the first direction x, and the pins 13 include a first pin 18. The first pin 18 is located in the chip bonding region 16 and is electrically connected to the test pad 3 via the third connection line 21. The third connection line 21 connected to the first pin 18 includes a first line segment 22 and a second line segment 23, the first line segment 22 extends in the second direction y in the step region 6, and the second line segment 24 is connected to the first line segment 23 and runs through the second panel edge 20.

Figure 11:
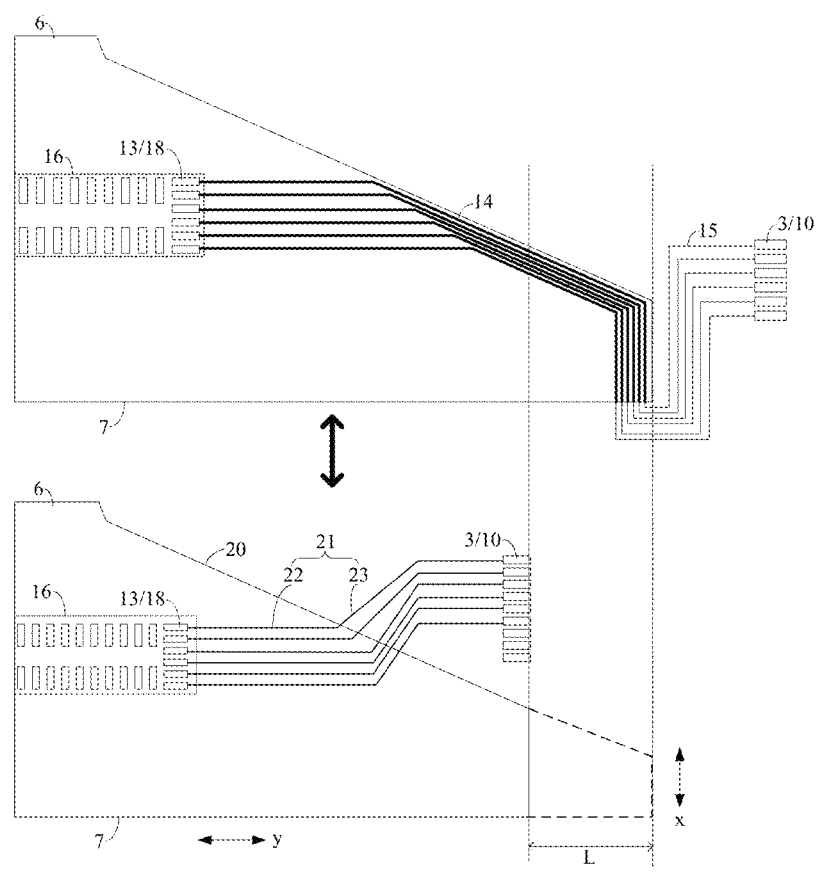
FIG. 11 is a schematic diagram comparing connection lines according to some embodiments of the present disclosure.

Typically, the chip bonding region 16 is located on a side of the second panel edge and is closer to the shoulder of the step region 6, so the connection line between the first pin 18 and the test pad 3 is more likely arranged using the extending manner of the third connection line 21. In addition, this third connection line 21 is designed to include the first line segment 22 and the second line segment 23, this third connection line 21 transversely extends to the second panel edge 20 and directly runs through the second panel edge 20 and then extends to the test pad 3, but does not longitudinally extend toward the first panel edge 7. FIG. 11 is a schematic diagram comparing connection lines according to some embodiments of the present disclosure. As shown in FIG. 11, the space occupied by the connection line in a corner of the step region 6 is omitted. For example, based on the present line layout in the step region 6, when the third connection line 21 extends in the above manner, a transverse width L of 1300 μm at the corner of the step region 6 can be saved, so the width of the step region 6 in the second direction y can be reduced, or the saved space can be used for arranging other structures.

Figure 12:
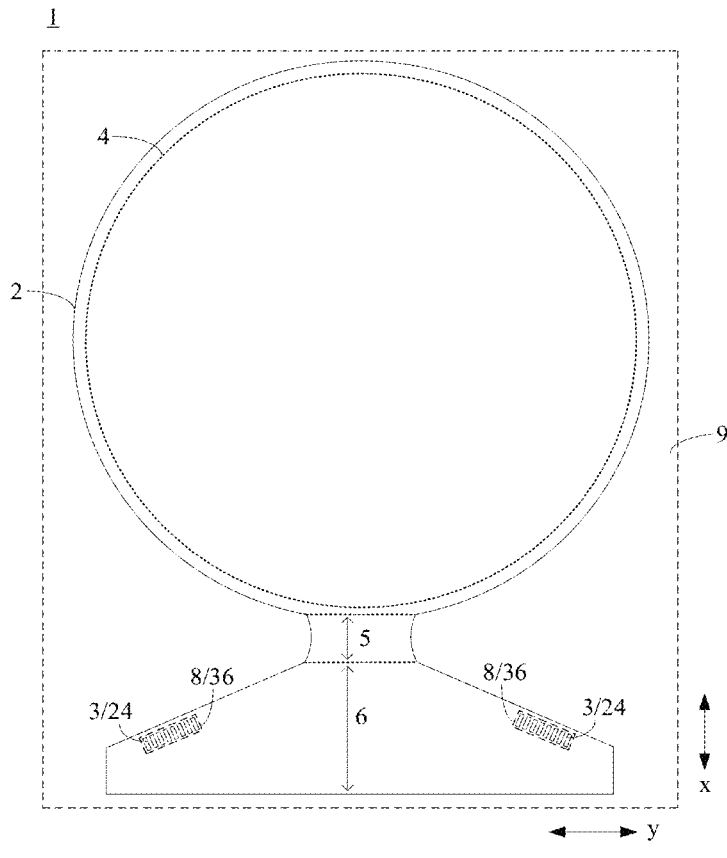
FIG. 12 is another schematic structural diagram of a single sub-region according to some embodiments of the present disclosure.

FIG. 12 is another schematic structural diagram of a single sub-region according to some embodiments of the present disclosure. In some embodiments of the present disclosure, as shown in FIG. 12, the test pads 3 include one or more second test pads 24. For a single second test pad 24, at least part of the second test pad 24 is located in the step region 6. That is, the single second test pad 24 may be entirely located in the step region 6, or, the single second test pad 24 includes a part located in the step region 6 and another part located in the cutting region 9.

In this embodiment, the second test pad 24 is closer to the pin 13 in the step region 6, and the connection line between the pin 13 and the test pad 3 may only extend in the step region 6. Therefore, the connection line does not occupy the space of the cutting region 9, thereby improving the type-setting rate of the display mother board.

Figure 13:
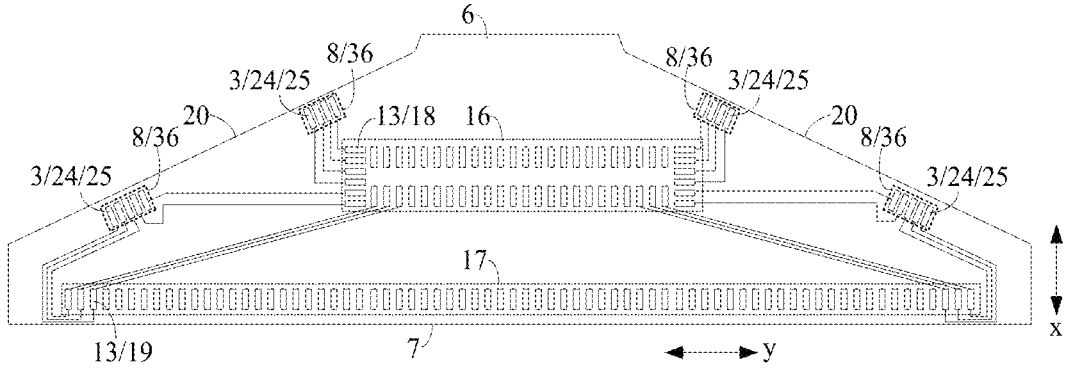
FIG. 13 is a schematic structural diagram of a step region according to some embodiments of the present disclosure.
Figure 14:
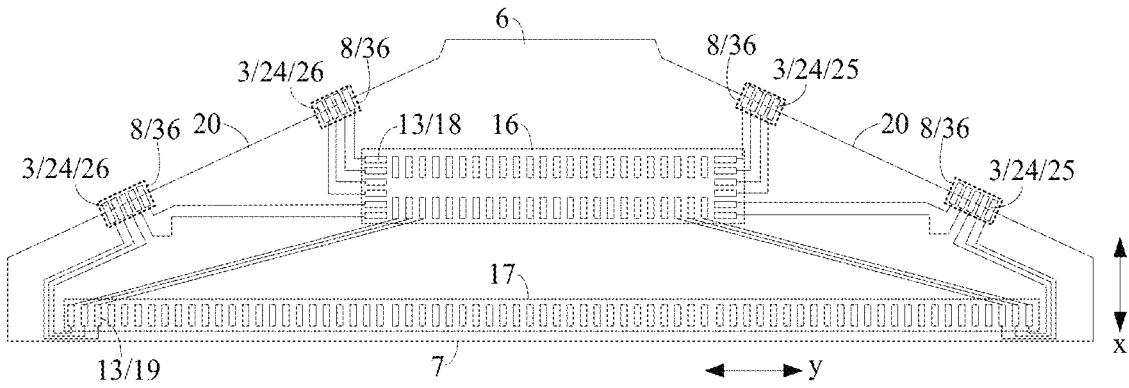
FIG. 14 is another schematic structural diagram of a step region according to some embodiments of the present disclosure.

FIG. 13 is a schematic structural diagram of a step region according to some embodiments of the present disclosure. FIG. 14 is another schematic structural diagram of a step region according to some embodiments of the present disclosure. In some embodiments of the present disclosure, as shown in FIG. 13 and FIG. 14, the display panel 2 further has a second panel edge 20, the second panel edge 20 is the edge of the step region 6, and an extension direction of the second panel edge 20 forms a first angle with the first direction x and forms a second angle with the second direction y. That is, the second panel edge 20 is an edge at a shoulder of the step region 6. The second test pads 24 include one or more first-type second test pads 25 located in the step region 6, and/or, the second test pads 24 include one or more second-type second test pads 26 overlapping with the second panel edge 20 in the direction perpendicular to the plane of the display mother panel. That is, a single second-type second test pad 26 includes a part located in the step region 6 and another part located in the cutting region 9.

It should be noted that, based on the above structure, when the display mother board is cut to form the display panels 2, the first-type second test pad 25 is entirely remained in the display panel 2, a part of the second-type second test pad 26 is remained in the display panel 2, and another part of the second-type second test pad 26 is cut off along with the cutting region 9.

In this structure, a single second test pad 24 may be entirely located in the step region 6, or a signal second test pad 24 may be partially located in the step region 6, which can be flexibly adjusted according to the overall structure in the step region 6.

In some embodiments of the present disclosure, as shown in FIG. 13 and FIG. 14, the display panel 2 further has a second panel edge 20, the second panel edge 20 is the edge of the step region 6, and an extension direction of the second panel edge 20 forms a first angle with the first direction x and forms a second angle with the second direction y. At least some second test pads 24 are located adjacent to the second panel edge 20 and are arranged along an extension direction of the second panel edge 20. In the structure that at least some second test pads 24 are located adjacent to the second panel edge 20 and are arranged along an extension direction of the second panel edge 20, the second test pad 24 may be entirely located in the step region 6 or partially located in the step region 6.

Typically, for a region closer to the shoulder edge of the step region 6, the line layout in this region is simpler. Therefore, it is easier to find a space near the shoulder edge of the step region 6 for arranging the second test pad 24, and the influence of the second test pad 24 on the layout of the existing lines and pins 13 in the step region 6 is reduced.

Figure 15:
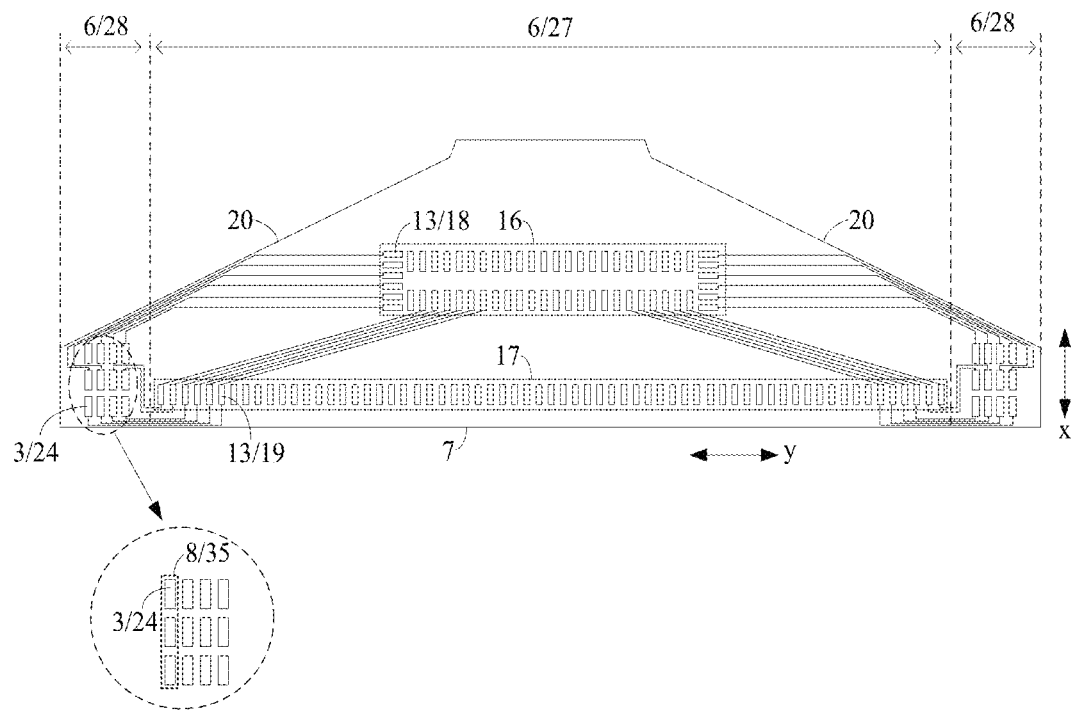
FIG. 15 is another schematic structural diagram of a step region according to some embodiments of the present disclosure.

FIG. 15 is another schematic structural diagram of a step region according to some embodiments of the present disclosure. In some embodiments of the present disclosure, as shown in FIG. 15, the step region 6 includes a middle step region 27 and edge step regions 28. The edge step regions 28 are located on two sides of the middle step region 27 in the second direction y. At least some of the second test pads 24 are arranged in an array in the edge step region 28. In an example structure, the step region 6 has a trapezoid shape, a length of the edge step region 28 in the first direction x is smaller than a length of the middle step region 27 in the first direction x, and the edge step region 28 is the corner of the step region 6.

The line layout in the edge step region 28 is simpler than that in the middle step region 27, and the edge step region 28 typically includes not pin 13. Therefore, in some embodiments of the present disclosure, at least some second test pads 24 are arranged in the edge step region 28, and accordingly, the step region 6 can include more second test pads 24.

Figure 16:
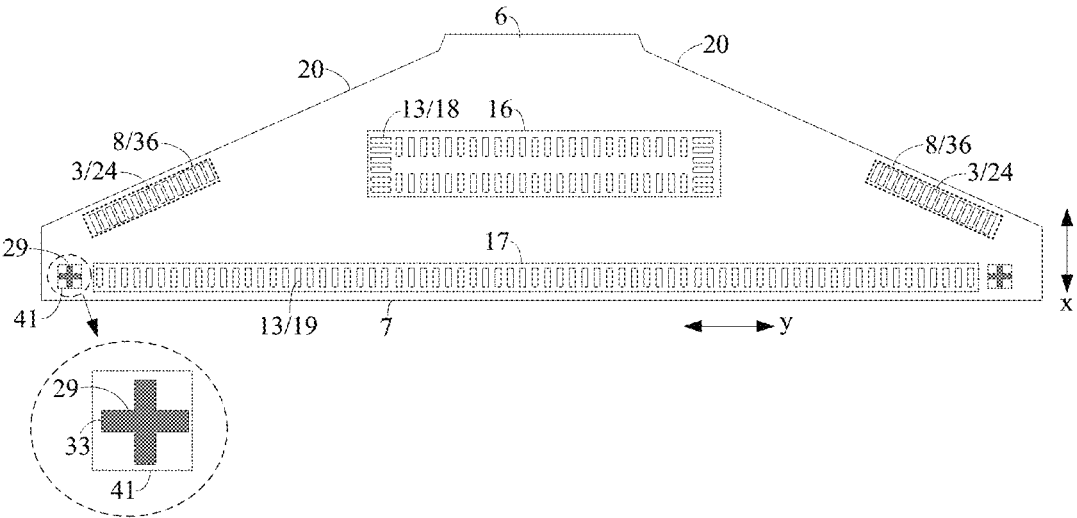
FIG. 16 is another schematic structural diagram of a step region according to some embodiments of the present disclosure.
Figure 17:
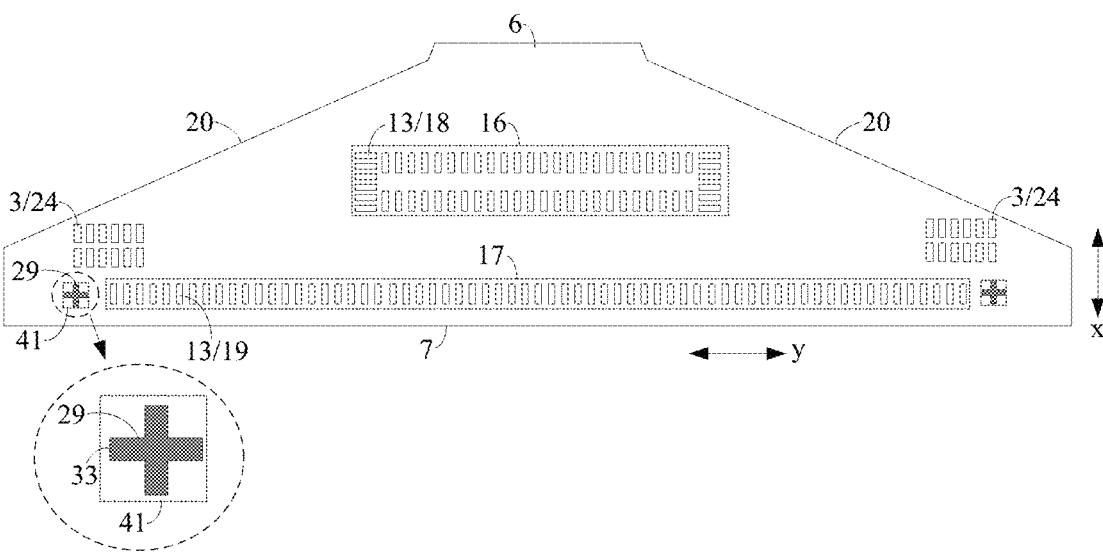
FIG. 17 is another schematic structural diagram of a step region according to some embodiments of the present disclosure.

FIG. 16 is another schematic structural diagram of a step region according to some embodiments of the present disclosure. FIG. 17 is another schematic structural diagram of a step region according to some embodiments of the present disclosure. In some embodiments of the present disclosure, as shown in FIG. 16 and FIG. 17, the step region 6 includes a chip bonding region 16 and a circuit board bonding region 17 arranged in the first direction x.

The sub-region 1 further includes one or more first alignment marks 29 located on at least one of two sides of the circuit board bonding region 17 in the second direction y. The first alignment mark 29 includes a first marking line 33. The second test pad 24 is located on a side of the first marking line 33 adjacent to the chip bonding region 16. In other words, the second test pad 24 is located on a side, adjacent to the chip bonding region 16, of a straight line where the first marking line 33 is located. With such arrangement, the second test pad 24 is reasonably located, and it is avoided that the length of the step region 6 of the display panel 2 in the second direction y is increased for accommodating the second test pad 24.

In addition, in order to ensure the precise alignment of the first alignment mark 29, the sub-region 1 further includes a first clean region 41, and the first alignment mark 29 is located in the first clean region 41.

Figure 18:
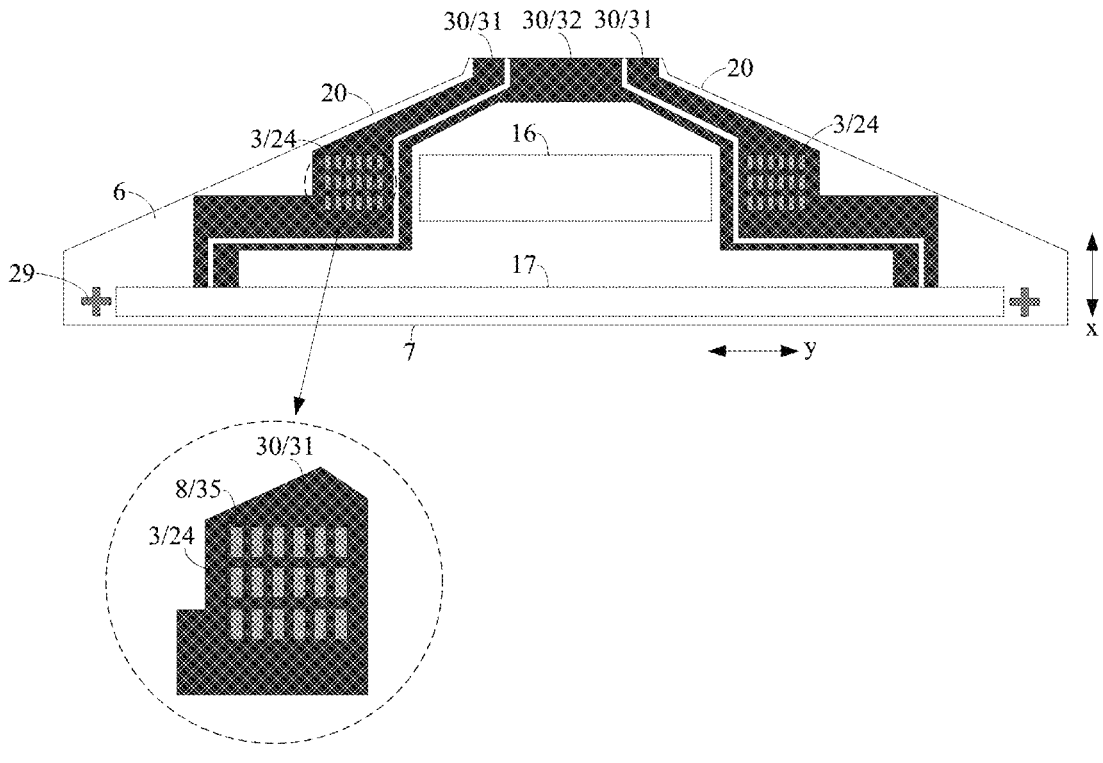
FIG. 18 is another schematic structural diagram of a step region according to some embodiments of the present disclosure.
Figure 19:
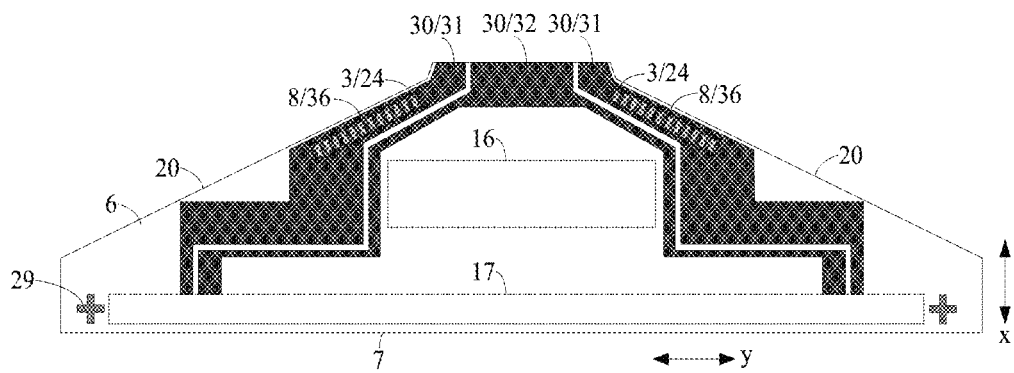
FIG. 19 is another schematic structural diagram of a step region according to some embodiments of the present disclosure.

FIG. 18 is another schematic structural diagram of a step region according to some embodiments of the present disclosure. FIG. 19 is another schematic structural diagram of a step region according to some embodiments of the present disclosure. In some embodiments of the present disclosure, as shown in FIG. 18 and FIG. 19, the step region 6 further includes a power supply bus 30. At least some of the second test pads 24 overlap with the power supply bus 30 in the direction perpendicular to the plane of the display mother board. For example, one or more second test pads 24 are located on a side of the power supply bus 30 adjacent to the light-exiting surface of the display panel 2. Therefore, in the VT test, a signal terminal may better supply the test signal to the second test pad 24.

In some embodiments of the present disclosure, the power supply bus 30 includes a positive power supply bus 31 and a negative power supply bus 32. In the direction perpendicular to the plane of the display mother board, at least some second test pads 24 overlap with the positive power supply bus 31.

Compared with other lines, the power supply bus 30 has a larger width and is closer to the outer side of the step region 6. The line layout of the region where the power supply bus is located is simpler. In some embodiments of the present disclosure, one or more second test pads 24 overlap with the power supply bus 30, so the space additionally occupied by the second test pads 24 in the step region 6 is saved, and the positions of the second test pads 24 are reasonably arranged.

Figure 20:
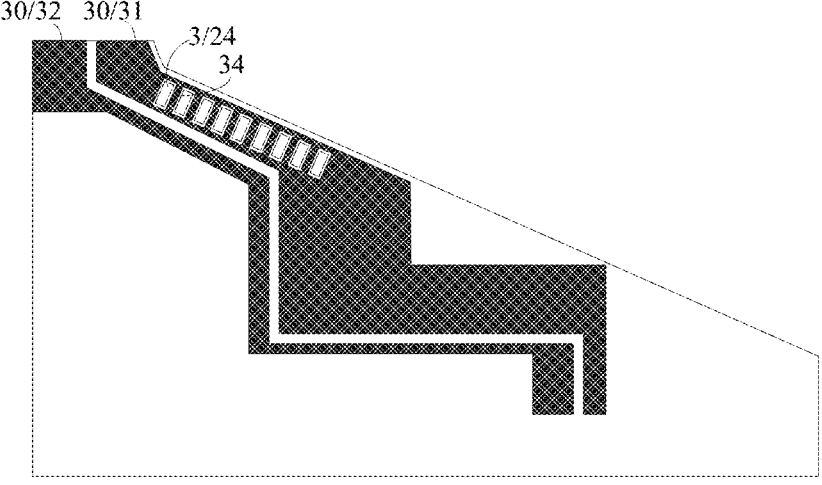
FIG. 20 is another schematic structural diagram of a step region according to some embodiments of the present disclosure.

FIG. 20 is another schematic structural diagram of a step region according to some embodiments of the present disclosure. In some embodiments of the present disclosure, as shown in FIG. 20, the step region 6 includes a power supply bus 30. The power supply bus 30 includes a hollowed region 34, and at least some second test pads 24 are located in the hollowed region 34.

In the VT test, the test voltage is typically applied to the test pad 3 by a pre-bonding method or a probe method. In the pre-bonding method, a signal terminal and the test pad 3 are pressed to be in contact, and then the signal terminal powers the test pad 3. In the probe method, the probe is in contact with the test pad 3 and powers the test pad 3. When the power supply bus 30 is provided with the hollowed region 34 and the second test pad 24 is arranged in the hollowed region 34, the second test pad 24 and a metal layer where the power supply bus 30 is located do not overlap with each other in the direction perpendicular to the plane of the display mother board. When the probe method is used for powering the second test pad 24, short-circuiting due to the contact between the probe and the power supply bus 30 is avoided, and the test reliability is improved.

In some embodiments of the present disclosure, one hollowed region 34 may be provided with at least one second test pad 24. For example, one hollowed region 34 is provided with one second test pad 24. In this embodiment, the area of a single hollowed region 34 is small, and the power supply bus 30 does not have a large-area and continuous hollowed region 34, so the reliability of the power supply bus 30 is not affected.

Figure 21:
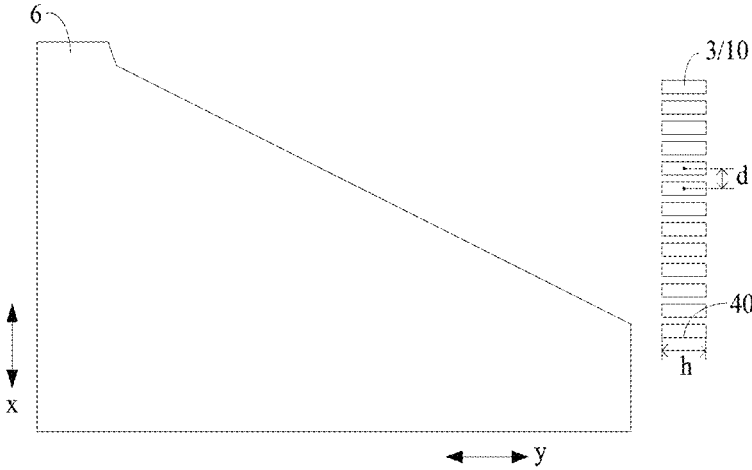
FIG. 21 is a schematic diagram showing dimension parameters of a test pad according to some embodiments of the present disclosure.

FIG. 21 is a schematic diagram showing dimension parameters of a test pad according to some embodiments of the present disclosure. In some embodiments of the present disclosure, as shown in FIG. 21, the test pad 3 includes two first edges 40 opposite to each other. At least two test pads 3 are adjacent, and the first edges 40 of the adjacent test pads 3 are opposite. For example, the test pad 3 includes two longer edges opposite to each other and two shorter edges opposite to each other, the length of the longer edge is larger than the length of the shorter edge, and the first edge 40 is the longer edge. At least two test pads 3 are adjacent with the first edge of one test pad 3 facing the first edge of another test pad 3.

In some embodiments of the present disclosure, the length h of the first edge 40 satisfies 600 μm<h≤800 μm, and/or, for the test pads 3 whose first edges are adjacent, a distance d between geometric centers of the adjacent test pads 3 satisfies 200 μm<d≤400 μm.

Conventionally, the test pads 3 are arranged below the display panel 2. In order to make the typesetting rate of the display mother panel meet requirement, the size of the test pad 3 is not too large, and the test pads 3 are arranged in one row to reduce the width in the first direction x of the space occupied by the test pads 3. Therefore, conventionally, the size of the test pad 3 and the distance between adjacent test pads 3 are small. Conventionally, the length of the long side of the test pad 3 is smaller than 600 μm, and the distance between the geometric centers of the adjacent test pads 3 is smaller than 200 μm.

In some embodiments of the present disclosure, the position of the test pad 3 is adjusted, and the influence of the test pads 3 on the typesetting rate of the display mother board is reduced. In this way, when designing the test pad 3, the restriction to the size of the test pad 3 and the distance between adjacent test pads 3 is reduced. Moreover, at least some test pads 3 are located in the cutting region 9 outside the display panel 2. The size of the test pad 3 and the distance between adjacent test pads 3 can be set larger, thereby improving the connection reliability between the signal terminal and the test pad 3 during the VT test.

In one or more embodiments, as shown in FIG. 3 to FIG. 10, FIG. 15, and FIG. 18, the first pad group 8 includes one or more first pad sub-groups 35, and the test pads 3 in the first pad sub-group 35 are arranged in the first direction x. In this way, the transverse length of the space occupied by the first pad sub-group 35 is reduced, not affecting the distance between display panels 2 adjacent in the second direction y.

As shown in FIG. 3 to FIG. 10, the test pads 3 in at least one first pad sub-group 35 are the first test pads 10, and/or, as shown in FIG. 15 to FIG. 18, the test pads 3 in at least one first pad sub-group 35 are the second test pads 24.

FIG. 22 is a schematic structural diagram of a single sub-region according to some embodiments of the present disclosure. In some embodiments of the present disclosure, as shown in FIG. 12, FIG. 13, FIG. 14, FIG. 16, FIG. 19, and FIG. 22, the first pad group 8 includes one or more second pad sub-groups 36, and the test pads 3 in the second pad sub-group 36 are arranged in a direction different from the first direction x.

As shown in FIG. 22, the test pads 3 in at least one second pad sub-group 36 are the first test pads 10, and/or, as shown in FIG. 12, FIG. 13, FIG. 14, FIG. 16, and FIG. 19, the test pads 3 in at least one second pad sub-group 36 are the second test pads 24.

Step regions 6 in different display panels 2 may have different dimensions. When the test pads 3 in the second pad sub-group 36 are arranged in an inclined direction, the transverse length of the space occupied by the second pad sub-group 36 is reduced, not affecting the distance between display panels 2 adjacent in the first direction x and providing a better flexibility.

In some embodiments of the present disclosure, as shown in FIG. 12, FIG. 13, FIG. 14, FIG. 16, FIG. 19 and FIG. 22, the display panel 2 further has a second panel edge 20. The second panel edge 20 is the edge of the step region 6. An extension direction of the second panel edge 20 forms included angles with the first direction x and the second direction y respectively. The test pads 3 in the second pad sub-group 36 are arranged in a direction parallel to the extension direction of the second panel edge 20. For example, as shown in FIG. 22, the second pad sub-group 36 is located in the cutting region 9 and is adjacent to the second panel edge 20. For another example, as shown in FIG. 19, the second pad sub-group 36 is located in the step region 6 and is adjacent to the second panel edge 20.

When the second pad sub-group 36 is located in the cutting region 9, the connection distance between the pin 13 and the test pad 3 in the second pad sub-group 36 may be reduced, and it is avoided that these test pads 3 are arranged beyond the display panel 2 in the second direction y and affect the density of the display panels 2 in the second direction y. When the second pad sub-group 36 is located in the step region 6, the test pads 3 in the second pad sub-group 36 are arranged in a region close to the second panel edge 20 and arranged along the second panel edge 20. Since the region close to the second panel edge 20 includes few even no lines, the influence of these test pads 3 on the existing lines in the step region 6 is reduced.

Figure 23:
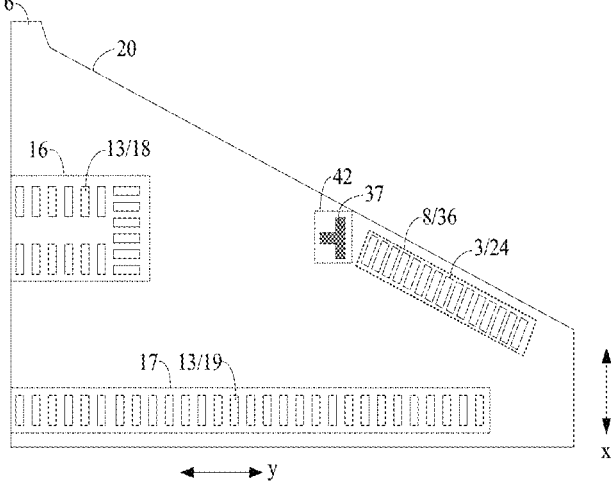
FIG. 23 is another schematic structural diagram of a step region according to some embodiments of the present disclosure.

FIG. 23 is another schematic structural diagram of a step region according to some embodiments of the present disclosure. In some embodiments of the present disclosure, as shown in FIG. 6, the step region 6 includes one or more second alignment marks 37 located on a side of the second pad sub-group 36. For example, the second alignment mark 37 is located on a first side of the second pad sub-group 36, and the first side is a side of the second pad sub-group 36 in the arrangement direction of the test pads 3 in the second pad sub-group 36. For example, an extension direction of an edge of the second alignment mark 37 is different from the arrangement direction of the test pads 3 in the second pad sub-group 36.

In addition, in order to ensure the precise alignment of the second alignment mark 37, the sub-region 1 further includes a second clean region 42, and the second alignment mark 37 is located in the second clean region 42.

In this structure, if the second pad sub-group 36 is offset to its target position due to process accuracy or other reasons, the risk that the second pad sub-group 36 overlaps with the second clean region 42 and the second alignment mark 37 is reduced, thereby improving the precise alignment of the second alignment mark 37.

Figure 24:
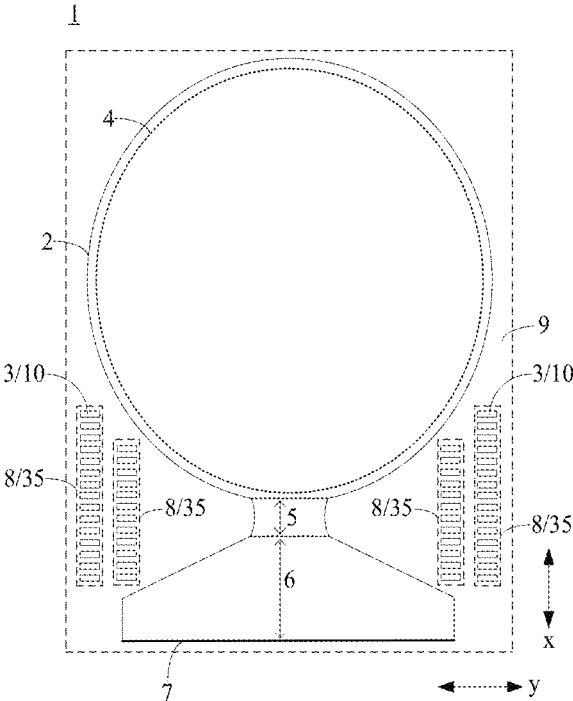
FIG. 24 is a schematic structural diagram of a single sub-region according to some embodiments of the present disclosure.

FIG. 24 is a schematic structural diagram of a single sub-region according to some embodiments of the present disclosure. It should be noted that, in some embodiments of the present disclosure, as shown in FIG. 24, at least two first pad groups 8 are adjacent in the sub-region 1, which is not limited by the present disclosure.

Figure 25:
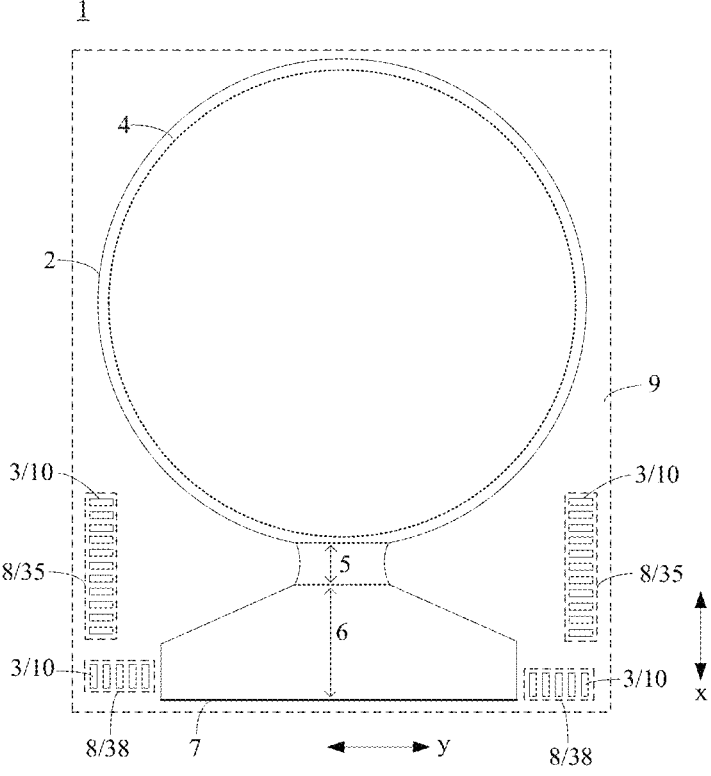
FIG. 25 is another schematic structural diagram of a step region according to some embodiments of the present disclosure.

FIG. 25 is another schematic structural diagram of a step region according to some embodiments of the present disclosure. In some embodiments of the present disclosure, as shown in FIG. 25, a length of the step region 6 in the second direction y is smaller than a length of the display region 4 in the second direction y. The sub-region 1 further includes one or more second pad groups 38 located on at least one of two sides of the first panel edge 7 in the second direction y. The second pad group 38 includes test pads 3 which are arranged in the second direction y.

The length of the step region 6 in the second direction y is smaller than the length of the display region 4 in the second direction y. Even if at least one of the two sides of the first panel edge 7 in the second direction y is provided with the second pad group 38, for the overall sub-region 1, the second pad group 38 does not additionally occupy a large space beyond the display panel 2 in the second direction y, or even does not additionally occupy any space beyond the display panel 2 in the second direction y. Therefore, the distance between display panels 2 adjacent in the second direction y is not affected. In addition, the second pad group 38 is very close to the display panel 2, especially to the second pins 19 in the circuit board bonding region 17, so length of the connection lines between the second pins 19 and the test pads 3 in the second pad group 38 are smaller, and the voltage drop of the test signal is smaller.

Figure 26:
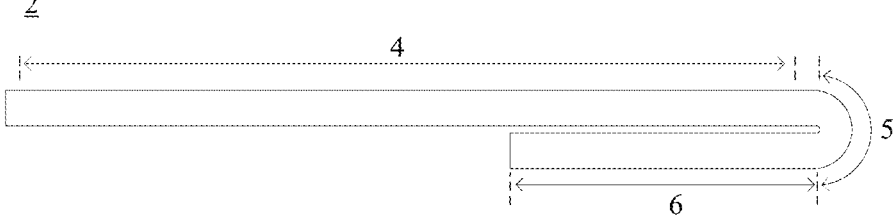
FIG. 26 is a schematic structural diagram of a display panel according to some embodiments of the present disclosure.
Figure 27:
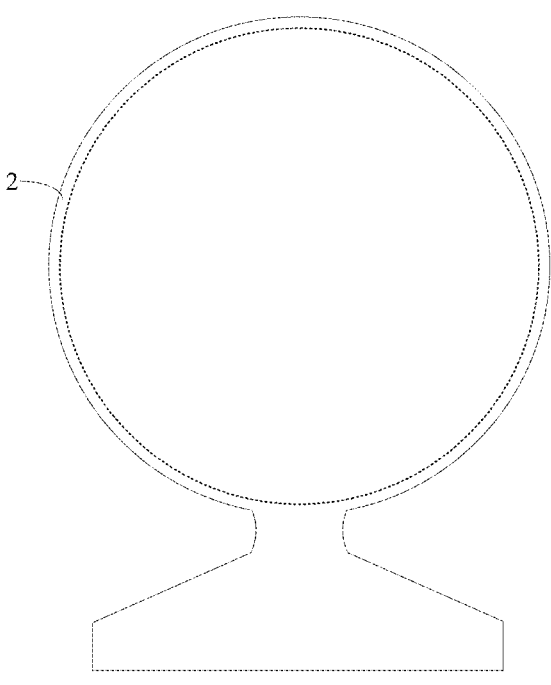
FIG. 27 is a plan view corresponding to FIG. 26 according to some embodiments of the present disclosure.
Figure 28:
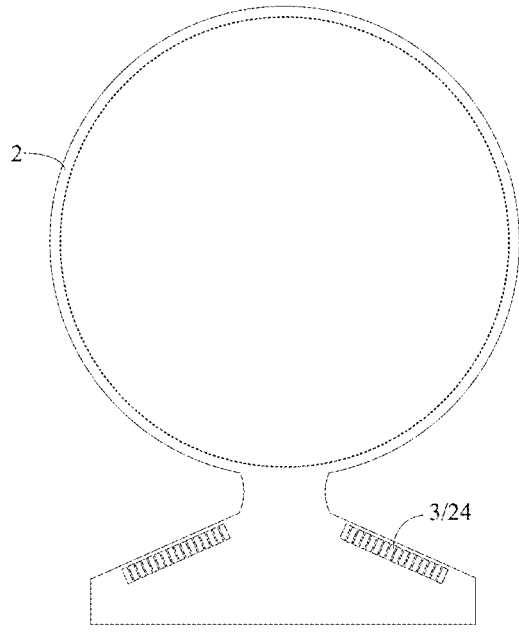
FIG. 28 is a plan view corresponding to FIG. 26 according to some embodiments of the present disclosure.

Embodiments of the present disclosure further provide a display panel 2. FIG. 26 is a schematic structural diagram of a display panel according to some embodiments of the present disclosure. FIG. 27 is a plan view corresponding to FIG. 26. FIG. 28 is a plan view corresponding to FIG. 26. As shown in FIG. 26 to FIG. 28, the display panel 2 is formed by cutting the above display mother board. As shown in FIG. 26, the wiring region 5 of the display panel 2 is bent towards a back side of the display region 4 so that the step region 6 is located on the back side of the display region 4. In the direction perpendicular to the plane of the display region 4, the step region 4 overlaps with the display region 4.

An example of cutting method is as follows. The display mother board is cut along edges the sub-regions 1 to form a plurality of independent and to-be-further-cut panel structures. Next, test voltages are applied to the test pads 3 in the panel structure, and the VT test is performed on the display panel 2 in the panel structure. Next, the panel structure is cut along the outer edge of the display panel 2 to form an independent display panel 2.

It should be noted that, as shown in FIG. 3 and FIG. 26, when the test pads 3 in the display mother board are all located in the cutting regions 9, the finally formed display panel 2 by cutting the display mother board does not include any test pad 3. As show in FIG. 12 and FIG. 27, when one or more test pads 3 in the display mother board are located in the step regions 6, and/or, when one or more test pads 3 in the display mother board overlap with the second panel edges 20, the finally formed display panel 2 by cutting the display mother board includes the test pad 3.

Figure 29:
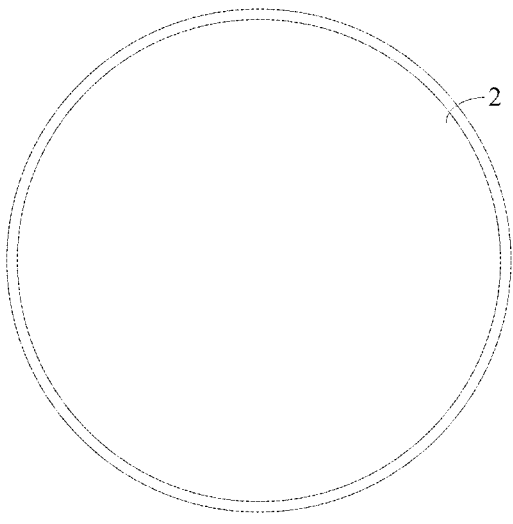
FIG. 29 is a schematic structural diagram of a display apparatus according to some embodiments of the present disclosure.

Embodiments of the present disclosure further provide a display apparatus. FIG. 29 is a schematic structural diagram of a display apparatus according to some embodiments of the present disclosure. As shown in FIG. 29, the display apparatus includes the above display panel 2. The specific structure of the display panel 2 has been described in details in the above embodiments, and is not repeated here. The display apparatus shown in FIG. 29 is for illustration rather than limitation. The display apparatus may be an electronic device with display function. For example, the display apparatus may be a smart watch or a mobile phone.

The above are merely exemplary embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various modifications, readjustments, and substitutions without departing from the scope of the present disclosure.

What is claimed is:

1. A display mother board, comprising a plurality of sub-regions, wherein at least two of the plurality of sub-regions are arranged in a first direction, and one of the plurality of sub-regions comprises:

a display panel comprising a display region, a wiring region, and a step region arranged in the first direction, wherein the display panel comprises a first panel edge, and the first panel edge is an edge of the step region and extends in a second direction intersecting the first direction; and test pads located on a side of the first panel edge adjacent to the display region, wherein one of the plurality of sub-regions comprises at least one first pad group each comprising at least two test pads of the test pads, and the at least two test pads in the first pad group are arranged in a direction different from the second direction.

2. The display mother board according to claim 1, wherein one of the plurality of sub-regions further comprises a cutting region surrounding the display panel; and the test pads comprise a first test pad located in the cutting region.

3. The display mother board according to claim 1, wherein a length of the wiring region in the second direction is smaller than a width of the display region in the second direction, and is smaller than a length of the step region in the second direction, and at least one of the test pads is located between the step region and the display region.

4. The display mother board according to claim 1, wherein one of the plurality of sub-regions comprises a first edge extending along the first direction, the test pads are located on a side of a first straight line away from the first edge adjacent to the first straight line, and the first straight line extends in the first direction and is tangent to the display panel at a point of the display panel closest to the first edge.

5. The display mother board according to claim 1, wherein the step region comprises pins, at least one of the pins each is electrically connected to one of the test pads sequentially via a first connection line and a second connection line, the first connection line extends in the step region to the first edge panel, and the second connection line is connected to the first connection line and extends from a side of the first panel edge away from the display region to the test pad connected to the second connection line.

6. The display mother board according to claim 5, wherein at least one second connection line is connected to the test pad at a side of the test pad adjacent to the display panel, and/or, at least one second connection line is connected to the test pad at a side of the test pad away from the display panel.

7. The display mother board according to claim 1, wherein the display panel further comprises a second panel edge, the second panel edge is the edge of the step region, and an extension direction of the second panel edge forms a first angle with the first direction and forms a second angle with the second direction, the step region comprises pins, at least one of the pins is electrically connected to a test pad of the test pads via a third connection line, the third connection line is located on a side of the first panel edge adjacent to the display region, and the third connection line runs through the second panel edge.

8. The display mother board according to claim 7, wherein the step region comprises a chip bonding region and a circuit board bonding region that are arranged in the first direction, the pins comprise a first pin located in the chip bonding region and electrically connected to the test pad via the third connection line, the third connection line connected to the first pin comprises a first line segment and a second line segment, the first line segment extends in the second direction in the step region, and the second line segment is connected to the first line segment and runs through the second panel edge.

9. The display mother board according to claim 1, wherein the test pads comprise second test pads, and for a single second test pad, at least part of the second test pad is located in the step region.

10. The display mother board according to claim 9, wherein the display panel further comprises a second panel edge, the second panel edge is the edge of the step region, and an extension direction of the second panel edge forms a first angle with the first direction and forms a second angle with the second direction, and the second test pads comprise a first-type second test pad located in the step region, and/or, the second test pads comprise a second-type test pad overlapping with the second panel edge in a direction perpendicular to a plane of the display mother board.

11. The display mother board according to claim 9, wherein the display panel further comprises a second panel edge, the second panel edge is the edge of the step region, and an extension direction of the second panel edge forms a first angle with the first direction and forms a second angle with the second direction, and at least two of the second test pads are located adjacent to the second panel edge and are arranged along an extension direction of the second panel edge.

12. The display mother board according to claim 9, wherein the step region comprises a middle step region and an edge step region located on two sides of the middle step region in the second direction, and at least some of the second test pads are arranged in an array in the edge step region.

13. The display mother board according to claim 9, wherein the step region comprises a chip bonding region and a circuit board bonding region arranged in a first direction, and the sub-region further comprises first alignment marks located on at least one of two sides of the circuit board bonding region in the second direction, and the first alignment mark comprises a first marking line, and the second test pad is located on a side of the first marking line adjacent to the chip bonding region.

14. The display mother board according to claim 9, wherein the step region comprises a power supply bus, and at least some of the second test pads overlap with the power supply bus in a direction perpendicular to a plane of the display mother board.

15. The display mother board according to claim 9, wherein the step region comprises a power supply bus comprising a hollowed region, and at least part of the second test pads is located in the hollowed region.

16. The display mother board according to claim 1, wherein the test pad comprises two first edges opposite to each other, and the first edges of at least some of the test pads are adjacent to each other, and a length h of the first edge satisfies 600 μm<h≤800 μm, and/or, for the test pads whose first edges are adjacent to each other, a distance d between geometric centers of the adjacent test pads satisfies 200 μm<d≤400 μm.

17. The display mother board according to claim 1, wherein the at least one first pad group comprises a first pad sub-group, and the test pads in the first pad sub-group are arranged in the first direction.

18. The display mother board according to claim 1, wherein the at least one first pad group comprises a second pad sub-group, and an arrangement direction of the test pads in the second pad sub-group is different from the first direction.

19. A display panel, formed by cutting a display mother board, wherein the display mother board comprises:

a plurality of sub-regions, wherein at least two of the plurality of sub-regions are arranged in a first direction, and one of the plurality of sub-regions comprises:

a display panel comprising a display region, a wiring region, and a step region arranged in the first direction, wherein the display panel comprises a first panel edge, and the first panel edge is an edge of the step region and extends in a second direction intersecting the first direction; and test pads located on a side of the first panel edge adjacent to the display region, wherein one of the plurality of sub-regions comprises at least one first pad group each comprising at least two test pads of the test pads, and the at least two test pads in the first pad group are arranged in a direction different from the second direction.

20. A display apparatus comprising a display panel formed by cutting a display mother board, wherein the display mother board comprises:

a plurality of sub-regions, wherein at least two of the plurality of sub-regions are arranged in a first direction, and one of the plurality of sub-regions comprises:

a display panel comprising a display region, a wiring region, and a step region arranged in the first direction, wherein the display panel comprises a first panel edge, and the first panel edge is an edge of the step region and extends in a second direction intersecting the first direction; and test pads located on a side of the first panel edge adjacent to the display region, wherein one of the plurality of sub-regions comprises at least one first pad group each comprising at least two test pads of the test pads, and the at least two test pads in the first pad group are arranged in a direction different from the second direction.

\* \* \* \* \*